United States Patent [19]

Imamura et al.

[11] Patent Number: 4,666,292

[45] Date of Patent: May 19, 1987

[54] PROJECTION OPTICAL APPARATUS AND A PHOTOGRAPHIC MASK THEREFOR

[75] Inventors: Kazunori Imamura, Tokyo; Yoshio Mori, Kawasaki, both of Japan

[73] Assignee: Nippon Kogaku K.K., Tokyo, Japan

[21] Appl. No.: 769,164

[22] Filed: Aug. 23, 1985

[30] Foreign Application Priority Data

Aug. 24, 1984 [JP] Japan .................... 59-175232
Apr. 2, 1985 [JP] Japan .................... 60-68536

[51] Int. Cl.⁴ .............................................. G03B 27/54
[52] U.S. Cl. ........................................ 355/67; 355/43; 355/125
[58] Field of Search ............... 355/43, 45, 67, 125, 355/30, 133, 71

[56] References Cited

U.S. PATENT DOCUMENTS

| | | | |
|---|---|---|---|
| 3,198,097 | 8/1965 | Hine | 355/67 X |
| 3,815,978 | 6/1974 | Marinace | 355/125 X |
| 4,377,339 | 3/1983 | Coppock | 355/45 X |
| 4,415,262 | 11/1983 | Koyama et al. | 355/125 |
| 4,416,538 | 11/1983 | Mueller et al. | 355/67 |

Primary Examiner—Richard A. Wintercorn
Attorney, Agent, or Firm—Michael N. Meller

[57] ABSTRACT

A projection optical apparatus used for projecting a pattern in the photolithographic operation for semiconductor device fabrication and a photographic mask used with the apparatus. In the projection optical apparatus, the reflected light from the pattern of a mask is utilized in place of the transmitted light through the pattern of the mask for the purpose of projecting the pattern. For this purpose, the projection optical apparatus includes illuminating optical means for projecting an illuminating light to the pattern of the mask and light guide means for directing the illuminating light reflected by the pattern of the mask to a projection optical system. A mask adapted for use with the apparatus contains a pattern composed of two opaque areas which are different in reflectance from each other.

11 Claims, 11 Drawing Figures

PROJECTION OPTICAL APPARATUS AND A PHOTOGRAPHIC MASK THEREFOR

BACKGROUND OF THE INVENTION

1. Field of the Invention

The present invention relates to a projection optical apparatus which is used, for example, in a semiconductor wafer printing apparatus for semiconductor fabrication to project a desired pattern and a photographic mask or reticle adapted for use therewith.

2. Description of the Prior Art

With projection optical apparatus heretofore used for photolithographic purposes, it has been the usual practice that the light transmitted through a photographic mask or reticle containing a pattern of opaque and transparent areas (hereinafter generally referred to as a mask) is utilized to print the pattern on a semiconductor wafer. Then, masks have been used in which a transparent substrate made of glass or the like is formed with a desired pattern by using a light blocking material such as chromium. When a mask of this type is illuminated from its one surface side by a suitable light source, the light is transmitted to the other surface side through the mask except the pattern portion. The transmitted light is projected to a desired projection optical system and thus the pattern is projected onto a given wafer.

Then, with this type of projection optical apparatus, if any dust, fingerprint or flaw exists on the portion of the mask substrate through which the light is to be transmitted, the light to be transmitted is intercepted. As a result, the pattern of the dust or the like is also projected with the resulting detrimental effect on the essential pattern to be projected. This results in the formation of defective elements or circuit on the semiconductor wafer or the like and the production efficiency is decreased.

SUMMARY OF THE INVENTION

It is an object of the present invention to provide a projection optical apparatus capable of reducing the occurrence of defects for a projected pattern due to dust or the like.

It is another object of the invention to provide a mask suitable for use with such projection optical apparatus.

In accordance with the invention, the projection of a pattern of a mask is achieved by utilizing its reflected light instead of its transmitted light. In other words, a projection optical apparatus according to the invention comprises illuminating optical means for projecting an illuminating light onto a mask pattern and light guide means for directing the illuminating light reflected from the mask pattern to a projection optical system.

In accordance with the present invention, a mask is provided which contains a pattern of two opaque areas different in reflectance from each other.

DESCRIPTION OF THE PREFERRED EMBODIMENTS

Figure 1:
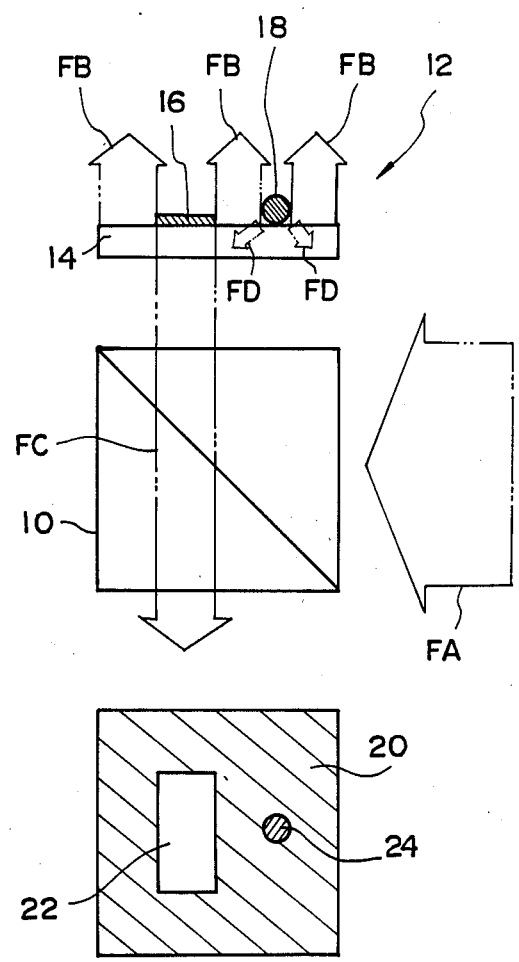
FIG. 1 shows a diagram useful for explaining the basic principle of a projection optical apparatus according to the present invention.

FIG. 1 is a diagram for explaining the basic principle of the present invention, in FIG. an illuminating light is projected to a prism 10 including an inclined partial transmission mirror from the right side of the figure as shown by an arrow FA. A mask 12 is arranged above the prism 10 so that the illuminating light projected as shown by the arrow FA is reflected toward the mask 12 by the action of the prism 10 and it impinges on the mask 12.

The mask 12 includes, for example, a pattern forming material 16 of chromium or the like deposited by a vacuum evaporation process or the like on a glass substrate 14 having a flat surface for the purpose of forming a desired pattern.

The illiminating light is projected onto the mask 12 from the opposite side of the glass substrate 14, i.e. the glass surface where the pattern forming material 16 is not deposited.

Of the illuminating light incident on the glass substrate 14, the light fallihg on the portion other than the pattern forming material 16 and the particle of dust 18 deposited on the transparent area is practically transmitted as shown by arrows FB. Also, the light falling on the portion of the pattern-forming material 16 is mirror reflected and directed along a light path opposite to that of the incident light as shown by an arrow FC since the incident plane is flat and the pattern forming material 16 is made by depositing a metal such as chromium on the flat surface. This reflected light is passed through the prism 10.

On the other hand, the illuminating light falling on the dust particles 18 is scattered as shown by arrows FD. As a result, the reflected light corresponding to the shape of the pattern-forming material 16 is mainly projected to a projection optical system (not shown). In other words, the pattern of the incident light to the projection optical system includes an area 20 corresponding to the transmitted light shown by the arrows FB, an area 22 corresponding to the reflected light shown by the arrow FC and an area 24 corresponding to the scattered light shown by the arrows FD and these areas excluding the area 22 are dark areas. It is to be noted that the area 20 has a light quantity which is equal to or less than that of the area 24.

While the foregoing represents the case where the dust particle 18 is on the same plane as the pattern-forming material 16, if the dust particle 18 is on the nondeposition side of the glass substrate 14, not only the illuminating light is scattered, thus reducing the mirror reflection component, but also there is an effect of a deviation of the focal position due to the thickness of the glass substrate 14. Thus, the image of the dust particle 18 is defocussed and so the danger of it appearing in the image of the projected pattern is reduced.

Contrary to the above-mentioned case, if the mask 12 is turned upside down and the illuminating light is projected from the pattern surface side of the mask 12, it is still possible to obtain the same effect by using a mirror surface for the surface of the pattern-forming material 16 and increasing its reflectance, thereby causing the illuminating light falling on the dust particle 18 to scatter. However, this method is disadvantageous in that if any dust deposits on the surface of the pattern forming material 16, the illuminating light incident on the dust particle is scattered and the image of the projected pattern is affected. From this point of view, it is preferable to project the illuminating light from the side of the nondeposition surface without the pattern-forming material as shown in FIG. 1. Also, by so doing, there is the effect of attenuating the scattered light of the dust particle 18 by the internal reflection of the glass substrate 14 and further decreasing the light reaching the projection optical system.

As described hereinabove, since the invention utilizes the reflected light from the mask 12, it is preferable to increase the reflectance of the light from the pattern-forming material 16. Also, the illuminating light source should preferably be of the type having a large light quantity. For example, a superhigh-voltage mercury vapor lamp or an excimer laser of the pulse emission type is suitable for use as the light source.

A first embodiment of the invention will now be described with reference to FIG. 2. In this embodiment, the invention is applied to a reduction projection-type exposure apparatus which is a kind of semiconductor wafer printing apparatus.

Figure 2:
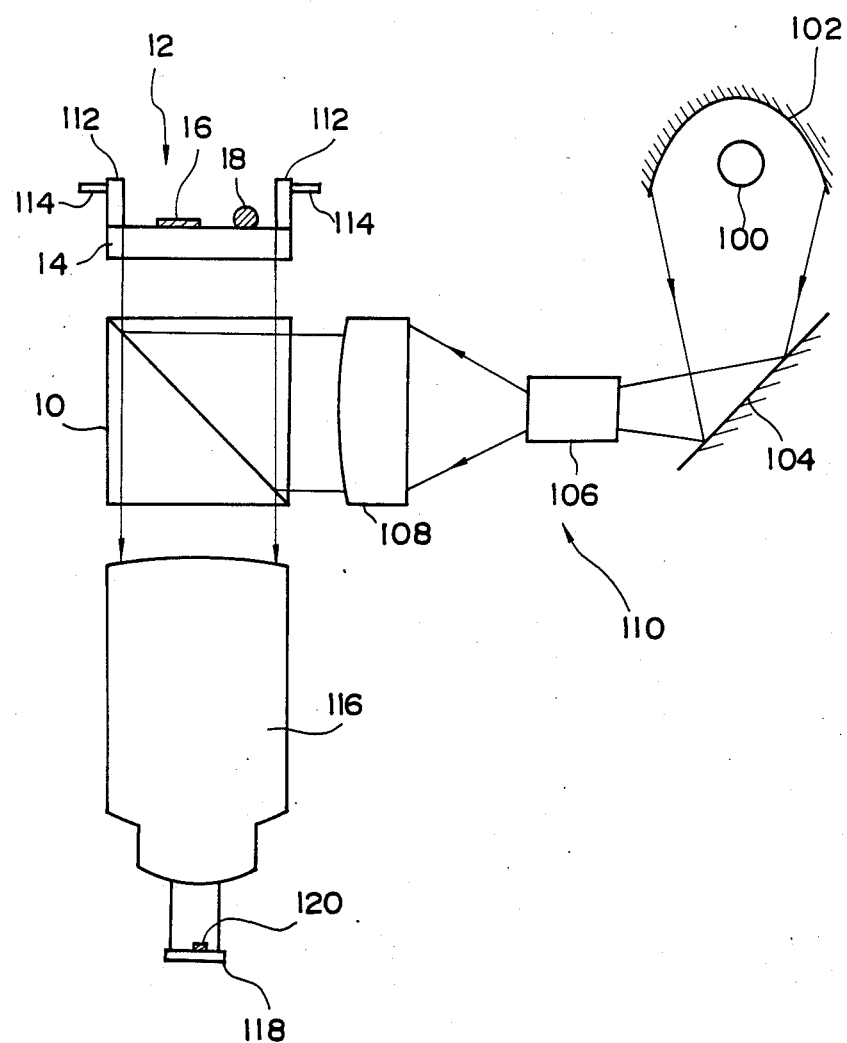
FIG. 2 shows the optical arrangement of a first embodiment of the invention.

In FIG. 2, arranged at the back of an exposure light source 100 is an ellipsoidal mirror 102 which condenses the light from the exposure light source 100. The condensed light is converted to a monochromatic light by an interference filter 104, converted to a uniform illumination distribution through a flyeye integrator 106 and then collimated by a condensing lens 108. The collimated light beam is projected as an illuminating light to a prism 10.

It is to be noted that in the following description, the ellipsoidal mirror 102, the interference filter 104, the flyeye integrator 106 and the condensing lens 108 are generally referred to as an illuminating optical system 110.

A mask 12 is arranged above the prism 10. The mask 12 includes a glass substrate 14 whose pattern surface side ends are fixedly supported by vacuum chucks 112. In other words, the mask 12 is chucked in place by the vacuum chucks 112 as a result of the evacuation by an exhaust system (not shown) through vacuum pipings 114 of the vacuum chucks 112. It is to be noted that since, in this embodiment, the illuminating light is projected from below the mask 12 or from the nondeposition surface side of the glass substrate 14 and resulting reflected light is utilized, the mask 12 is supported on its upper surface side so as to not impede the incidence and reflection of the illuminating light.

Also, a projection optical system 116 is arranged below the prism 10 or at a position on the side opposite to the mask 12 and a wafer 118 is arranged below the projection optical system 116. The projection optical system 116 may be composed of a reduction projection lens, isometric projection lens, isometric projection mirror or the like.

Next, the overall operation of this embodiment will be described. The light emitted from the exposure light source 100 is converted to a monochromatic collimated light beam of a uniform illumination distribution through the illuminating optical system 110 and then projected to the prism 10. Then, the illuminating light is diverted upward and projected onto the mask 12.

A part of the incident illuminating light is reflected by a pattern-forming material 16 and the reflected light is projected to the projection optical system 116 through the prism 10. Thus, a pattern 120 of the pattern-forming material 16 is formed on the pattern printing surface of the wafer 118 by the projection optical system 116.

While the illuminating light is also reflected by the nondeposition surface of the glass substrate 14 of the mask 12, this reflected light is very small. Also, the illuminating light falling on a dust particle 18 is practically scattered as mentioned previously in connection with FIG. 1.

As a result, there is no danger of the image of the dust particle 18 being formed on the wafer 118.

Figure 3:
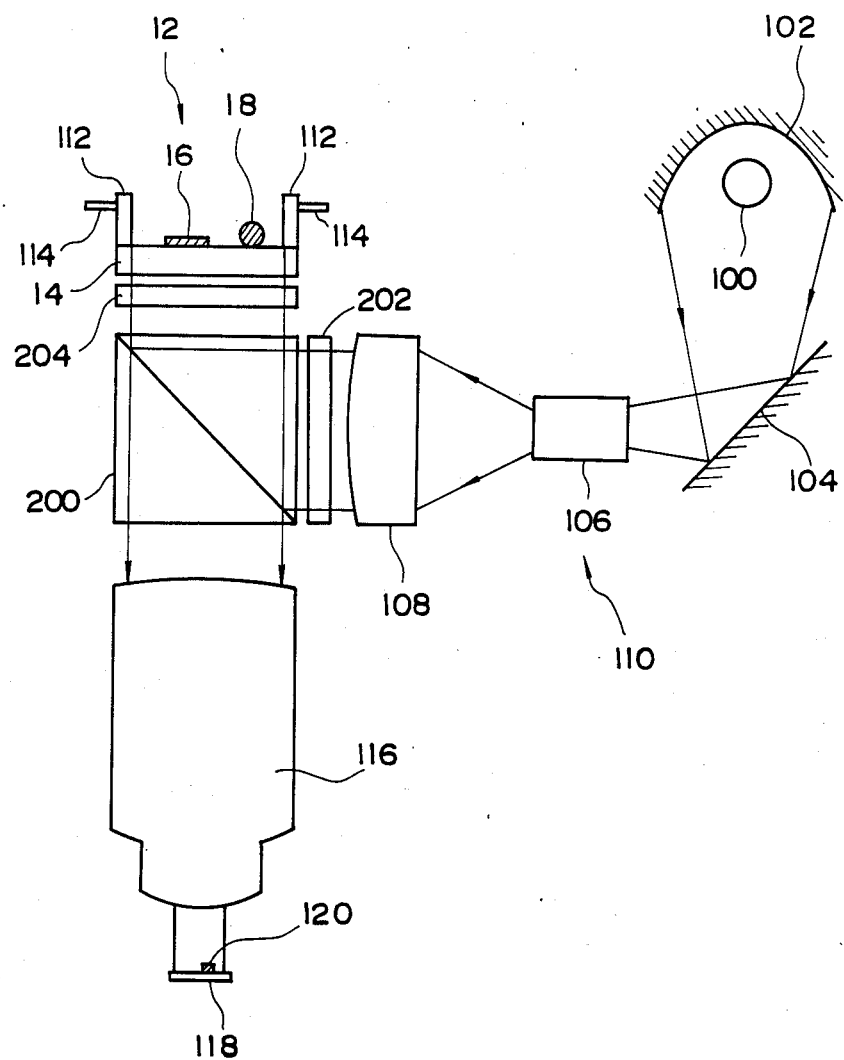
FIG. 3 shows the optical arrangement of a second embodiment of the invention.

A second embodiment of the invention will now be described with reference to FIG. 3. The same component parts as the counterparts of the previously mentioned first embodiment are designated by the same reference numerals.

The second embodiment differs from the previously mentioned first embodiment of FIG. 2 in that the prism 10 functions as a polarizing beam splitter 200 whose light path is changed depending on the direction of polarization of light and therefore a polarizing plate 202 and a ¼ wavelength plate ($\lambda/4$ plate) 204 are used.

More specifically, the polarizing plate 202 is arranged between the polarizing beam splitter 200 and the condensing lens 108 and the $\lambda/4$ plate 204 is arranged between the polarizing beam splitter 200 and the glass substrate 14 of the mask 12.

The operation of the second embodiment is as follows. The condensing lens 108 passes the monochromatic light from the interference filter 104 so that the monochromatic light is subjected to a predetermined degree of polarization by the polarizing plate 202 and then projected to the polarizing beam splitter 200. Thus, the polarizing beam splitter 200 reflects the incident light substantially 100% upward, i.e toward the mask 12. Then, the reflected illuminating light is converted to a desired circularly polarized light by the $\lambda/4$ plate 204 and projected onto the mask 12. Then, the illuminating light is reflected by the pattern-forming material 116, thus producing an oppositely rotated light. When this light is again passed through the $\lambda/4$ plate 204, a linearly polarized light with the plane of polarization rotated by 90° is obtained. In other words, the plane of polarization of the light incident to the $\lambda/4$ plate 204 from the polarizing beam splitter 200 differs by 90° from that of the light incident to the polarizing beam splitter 200 from the $\lambda/4$ plate 204. As a result, the illuminating light reflected by the pattern-forming material 16 travels straight forward through the polarizing beam splitter 200 and it is projected to the projection optical system 116.

As described hereinabove, in this embodiment the illuminating light is subjected to suitable polarizations so as to separate the incident light from the reflected light and in this way the illuminating light incident to the photographic mask 12 and the incident light to the wafer 118 are prevented from decreasing in light quantity.

Figure 4:
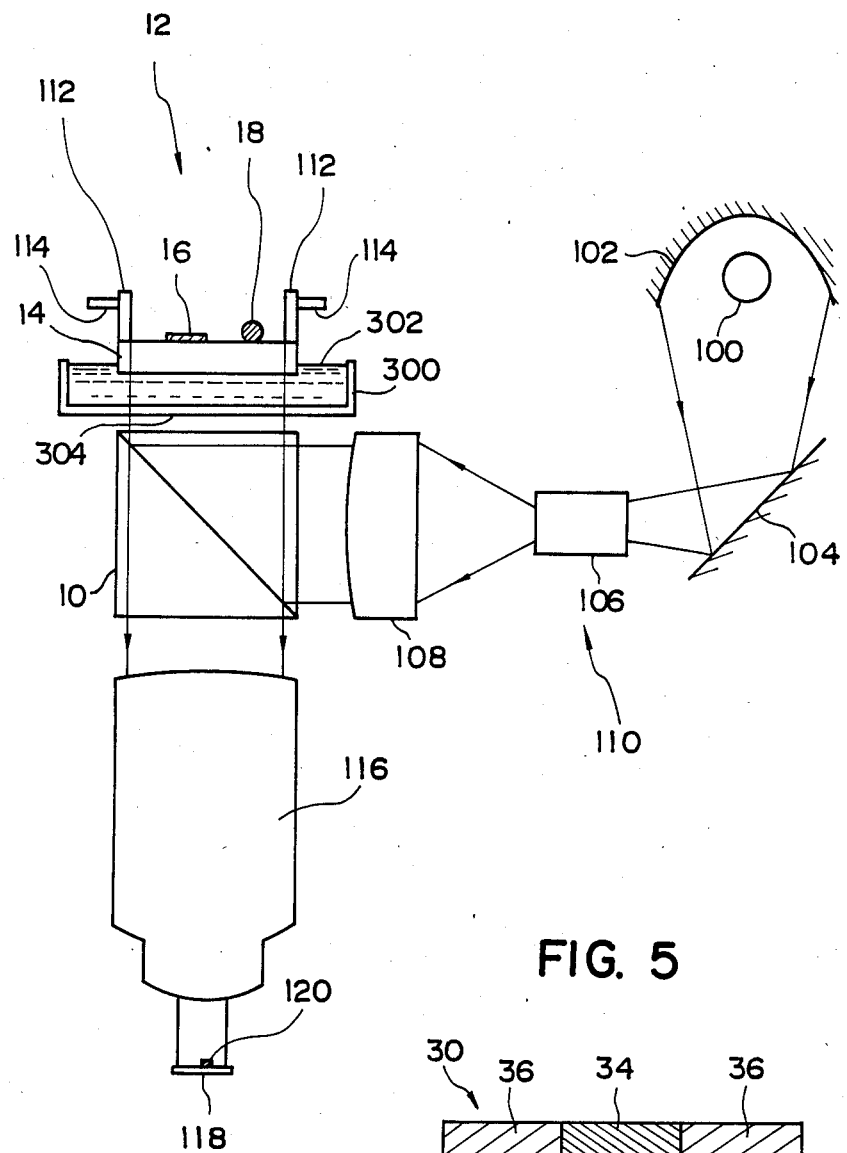
FIG. 4 shows the optical arrangement of a third embodiment of the invention.

Next, a third embodiment of the invention will be described with reference to FIG. 4. The same reference numerals are used for the same component parts as the counterparts in the previously described embodiments.

The third embodiment differs from the embodiment of FIG. 2 in that there is provided a liquid tank 300 filled with a desired liquid.

More specifically, the liquid tank 300 is arranged below the mask 12 and it is filled with a liquid 302. The glass substrate 14 of the mask 12 has its lower surface immersed in the liquid 302 and the liquid 302 is selected such that the refractive indices of the glass substrate 14 and the liquid 302 are substantially the same. Also, the lower side of the liquid tank 300, i.e. its glass surface 304 on the prism side has a higher degree of flatness accuracy.

The third embodiment operates as follows. The illuminating light incident to the prism 10 from the illuminating optical system 110 is reflected by the prism 10 and projected to the liquid tank 300 from which the light is projected to the mask 12. Also, the light reflected by the pattern-forming material 16 of the mask 12 is again passed through the liquid tank 300 and projected to the prism 10. In the course of this incidence and reflection of the illuminating light, the occurrence of any aberration of the optical system, etc., is prevented due to the improved flatness of the glass surface 304 of the liquid tank 300. Also, with the glass substrate 14 of the mask 12, there are instances where its flatness, particularly the flatness of its nondeposition surface, cannot always be improved from the mask preparation point of view and also its thickness cannot be satisfactorily controlled. Such variations in the flatness and thickness of the glass substrate 14 are corrected by the liquid 302 in the liquid tank 300. As a result, the length of the optical light path at the lower surface of the glass substrate 14 becomes uniform all over the surface of the glass substrate 14 and the aberration of the optical system employing the projection optical system 116 is maintained constant without being influenced by variations in the thickness and flatness of the glass substrate 14, thus forming an accurate projection optical system. This also has the effect of preventing the occurrence of reflection at the lower surface of the glass substrate 14.

In the previously described embodiments, an antireflection coating may be applied to the pattern surface of the glass substrate 14 of the mask 12 so as to further improve the contrast of the image of the pattern.

While the embodiments have been described only in connection with the foreign particle deposited on the mask, the same applies to the case of flaws, etc., on the substrate of masks.

Next, some embodiments of a mask well suited for use in the photolithographic operation performed by the use of the projection optical apparatus of the above embodiments will be described. While, in the foregoing description, the masks 12 are of the ordinary type having a pattern of opaque and transparent areas, each of the below-mentioned photographic masks has a pattern consisting of opaque areas alone.

Figure 5:
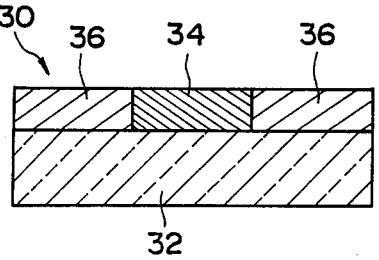
FIG. 5 is a sectional view showing a first embodiment of a photographic mask according to the invention.

Referring to FIG. 5, a photographic mask 30 is formed with a suitable pattern composed of reflecting layers 34 and 36 of different reflectances to light. The reflecting layer 34 of a higher reflectance is made, for example, of a vapor-deposited film of aluminum (Al) and the reflecting layer 36 of a lower reflectance is made, for example of a vapor-deposited film of chromium (Cr) or gold (Au). The greater the difference in reflectance, the better suited the reflecting layers 34 and 36 will be, and each of them is made of an optically opaque material. In other words, the reflecting layers 34 and 36 are made of materials having different light absorption indices. It is to be noted that if considered in terms of the ordinary mask, the high reflectance layer 34 corresponds to the transparent area and the low-reflectance layer 36 corresponds to the opaque area.

The overall operation of this embodiment will now be described. Where the photographic mask 30 is mounted in a projection optical apparatus of the same type as in FIG. 2, the illuminating light from the prism 10 is projected onto the mask 30 through the lower surface of a glass substrate 32.

Figure 6:
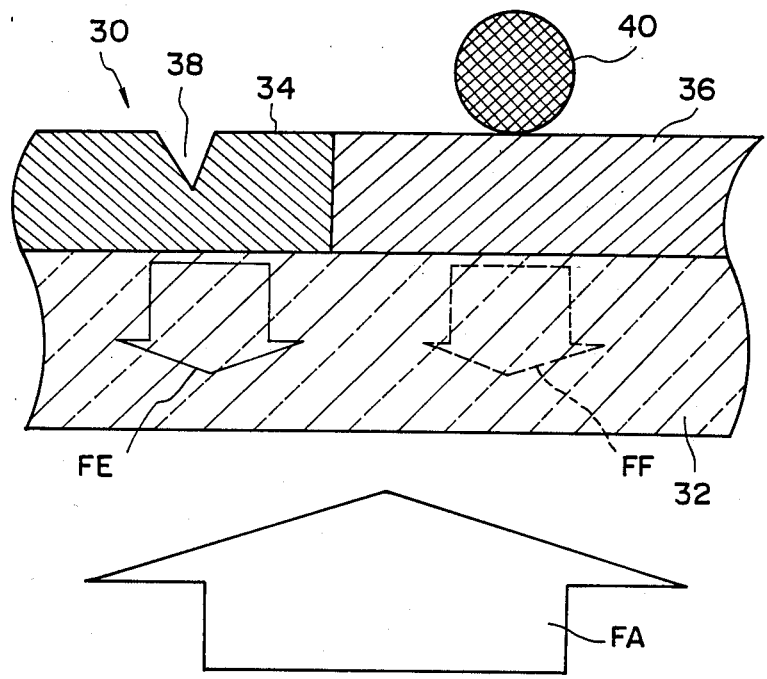
FIG. 6 is a diagram showing the optical action of the photographic mask of FIG. 5.

In FIG. 6 showing a part of the mask 30 in enlarged form, the high-reflectance layer 34 of the mask 30 has a flaw 38 and a dust particle 40 is deposited on the low-reflectance layer 36. The glass substrate 32 transmits practically all the illuminating light projected through the prism 10 as shown by an arrow FA. The reflected light from the lower surface of the glass substrate 32 is very small.

When the illuminating light transmitted through the glass substrate 32 reaches the reflecting layers 34 and 36, the light is mirror reflected in the opposite direction as shown by arrows FE and FF in accordance with the reflectances of the respective layers. Thus, despite the presence of the flaw 38 and the dust particle 40, the illuminating light is not affected by them and it is reflected by the reflecting layers 34 and 36. The reflected light is passed through the prism 10 and it is further passed through the projection optical system 116 thus forming its image on the wafer 118.

Since the reflecting layers 34 and 36 are formed in the desired pattern as mentioned previously, the variations in the intensity of the reflected light correspond to the pattern. Thus, the projection of the desired pattern is achieved by the formation of the image of the reflected light on the wafer 118. In this case, the surface of the wafer 118 and the boundary surface between the glass substrate 32 and the reflecting layers 34 and 36 become optically conjugate with each other.

On the other hand, if the dust particle 40 is present on the lower surface of the glass substrate 32, there is an effect of a deviation in the focal position due to the thickness of the glass substrate 32 in addition to the reduced mirror reflection component due to the scattering of the illuminating light. As a result, the image of the dust particle 40 is defocussed and there is little danger of the image being projected as a pattern.

Even in the case where the mask 30 is turned upside down and the illuminating light is projected from the pattern surface side, by making the surfaces of the reflecting layers 34 and 36 mirror surfaces to increase the difference in reflectance between the two, it is possible to cause scattering of the illuminating light falling on the dust particle 40 and thereby obtain the same effect. However, this method is disadvantageous in that if particularly dust is deposited on the surface of the high-reflectance layer 34, the illuminating light impinging on the dust is scattered, thus influencing the contrast during the pattern projection. In view of this fact, the illuminating light should preferably be projected onto the pattern surface through the glass substrate as shown in FIG. 6.

Figure 7:
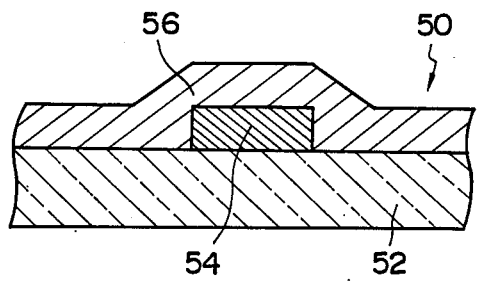
FIG. 7 is a sectional view showing a second embodiment of the photographic mask accordig to the invention.

Another embodiment of the photographic mask will now be described with reference to FIG. 7. In the FIG. 7, a mask 50 includes a high-reflectance layer 54 formed in a desired pattern on a glass substrate 52 and a low-reflectance layer 56 formed all over the glass substrate 52 to cover the high-reflectance layer 54. Note that these reflecting layers may be formed such that, the law-reflectance layer 56 is covered by the high-reflectance layer 54.

With the mask 50, the reflectances to the illuminating light as seen from the side of the glass substrate 52 are the same as in the previously mentioned embodiment and the same effect is obtained. This construction rather proves to be more practical in consideration of the forming process of the reflecting layers 54 and 56.

Figure 8:
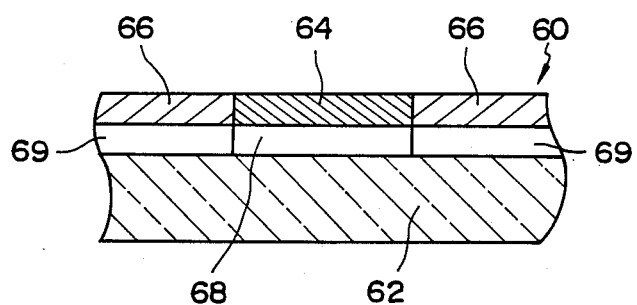
FIG. 8 is a sectional view showing a third embodiment of the photographic mask according to the invention.

In still another embodiment shown in FIG. 8, a mask 60 includes one or more layers of thin films 68 and 69 formed between a glass substrate 62 and reflecting layers 64 and 66. The thin films 68 and 69 perform a reflection-amplifying function for the high-reflectance layer 64 and a reflection-preventing function for the low-reflectance layer 66. More specifically, generally the light used for exposure purposes is single-wavelength light of about 436 nm, for example. As a result, the reflected light as a whole is increased or decreased depending on the first reflected light at the boundary surface of the thin films 68 and 69 and the glass substrate 62 and the second reflected light from the reflecting layers 64 and 66 due to the principle of interference. For example, if the phase difference between the first and second reflected lights is an odd multiple of ½ wavelength, they cancel each other by interference and the reflection-preventing effect is produced. Also, if the phase difference is an even multiple of ½ wavelength, the two reflecting lights intensify each other and the reflection-increasing effect is produced. Thus, by suitably selecting the film thickness of the thin films 64 and 66 in consideration of the wavelength of the illuminating light and the reflectances of the reflecting layers 64 and 66, it is possible to obtain the reflection amplifying and preventing effects and increase the contrast of the pattern image.

Figure 9:
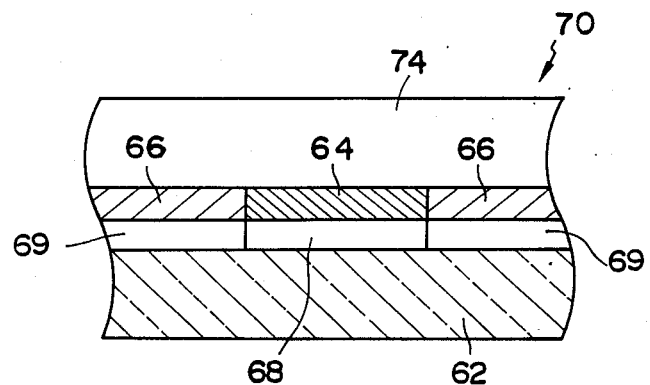
FIG. 9 is a sectional view showing a fourth embodiment of the photographic mask according to the invention.

In still another embodiment shown in FIG. 9, a mask 70 is identical with the mask 60 of FIG. 8 except that a protective layer 74 is provided at the top. The protective layer 74 is made, for example, of metal, glass or resin. Since the reflecting layers 64 and 66 are both opaque, the provision of the protective layer 74 gives rise to no particular inconvenience. This rather has the effect of preventing the pattern from changing due to the occurrence of flaws or the like in the reflecting layers 64 and 66.

In still another embodiment shown in FIG. 10, a mask 80 is formed in the following manner. A thin film 84 serving as a reflection-increasing layer is first formed over the principal surface of a glass substrate 82 and then a high-reflectance layer 86 is formed over the entire thin film 84. Then, the high-reflectance layer 86 and the thin film 84 are etched by the photolithographic technique to leave the desired pattern portion. Then, a thin film 88 serving as a reflection-preventing layer is formed over layer 86 and portions of substrate 82 not covered by thin film 840, and also a low-reflectance layer 89 is formed over the entire thin film 88. Of course, the same effect can be obtained by forming the high-reflectance layer 86 to cover the low-reflectance layer 89.

Figure 10:
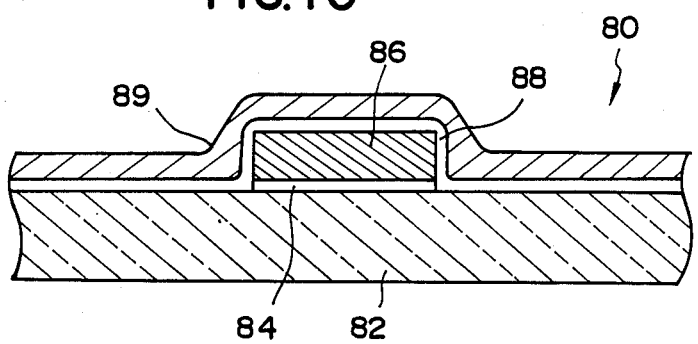
FIG. 10 is a sectional view showing a fifth embodiment of the photographic mask according to the invention.
Figure 11:
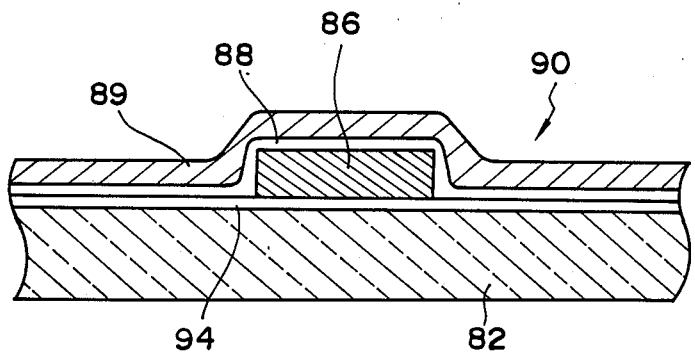
FIG. 11 is a sectional view showing a sixth embodiment of the photographic mask according to the invention.

In still another embodiment shaw in of FIG. 11, a mask 90 differs from the mask 80 shown in FIG. 10 only in that a thin film 94 corresponding to the thin film 84 is formed over the entire surface of the glass substrate 82. The film thickness of the thin film 94 is selected in such a manner that it serves as a reflection-increasing layer for the high-reflectance layer 86 and it also serves, in cooperation with the other thin film 88, as a reflection-preventing layer for the low-reflectance layer 89. These masks 80 and 90 are easier to produce and are more practical in construction. It is to be noted that the same effect can be obtained by arranging so that the high-reflectance layer 86 covers low-reflectance reflectance layer 89. In this case, however, the reflection-increasing function is provided by the portion where the thin films 88 and 94 overlap one another.

The present invention is not limited in any way to the embodiments described hereinabove and various modifications and changes may be made with respect to the combination of a substrate, reflecting layers, thin films and a protective layer. Also, suitable materials are not limited to those disclosed ones and they are applicable to both masks and reticles. In particular, the materials of reflecting layers serving as pattern-forming materials are required only to have light-blocking properties for the wavelength of an illuminating light to be used or light of a light-sensitive wavelength of light sensitive material and they may be semitransparent to light of other wavelengths.

I claim:

1. An optical apparatus for projecting a pattern arranged in a first plane onto a second plane, said apparatus comprising:
   a transparent substrate having said pattern arranged on a first surface thereof, said pattern including first and second opaque areas of different reflectances;
   projection optical means arranged along an optical path between said first plane and said second plane;
   means for supporting said transparent substrate in such a manner that a second surface of said substrate faces said projection optical means and said first surface coincides with said first plane;
   radiation means for producing a radiation beam; and
   light guide means arranged along said optical path between said first plane and said second plane for first directing said radiation beam toward said first plane and then directing the portion of said radiation beam reflected by said pattern toward said projection optical means.

2. A photographic mask for directing part of the radiation produced from a source toward a projection optical system, said mask comprising:
   a transparent substrate having a first surface through which said radiation is projected to the inside thereof; and
   a pattern forming means provided on a second surface of said substrate to reflect part of said projected radiation toward said projection optical system through said first surface, said pattern forming means including a first layer having a first reflectance and provided to form a desired pattern on said second surface and a second layer having a second reflectance different than said first reflectance and provided to form a background of said desired pattern, said first and second layers being opaque whereby substantially all of said radiation is blocked by said pattern forming means.

3. A photographic mask according to claim 2, wherein said pattern forming means further includes a thin film provided between said first layer and said substrate to increase the reflection of said radiation by said first layer.

4. A photographic mask according to claim 3, wherein said thin film has a thickness selected such that the phase difference between a first reflected portion of the radiation at said second surface of said substrate and a second reflected portion of the radiation at said first layer is an even multiple of $\frac{1}{2}$ wavelength of the radiation.

5. A photographic mask according to claim 2, wherein said pattern forming means further includes a thin film provided between said second layer and said substrate to decrease the reflection of said radiation by said second layer.

6. A photographic mask according to claim 5, wherein said thin film has a thickness selected such that the phase difference between a first reflected portion of the radiation at said second surface of the substrate and a second reflected portion of the radiation at said second layer is an odd multiple of $\frac{1}{2}$ wavelength of the radiation.

7. A photographic mask according to claim 2, further comprising a protective layer provided on said pattern forming means.

8. An optical apparatus for projecting a pattern on a first plane onto a second plane, said pattern being formed on one surface of a transparent substrate, said apparatus comprising:
Projection optical means arranged between said first plane and said second plane for forming an image of said pattern on said second plane;
means for supporting said transparent substrate in such a manner that the other surface of said transparent substrate faces said projection optical means and said one surface coincides with said first plane;
radiation means for producing a radiation beam; and
light guide means for directing said radiation beam from between said first plane and said second plane toward said pattern through said the other surface and directing said radiation beam reflected by said pattern and passed through said the other surface toward said projection optical means.

9. An optical apparatus according to claim 8, wherein said light guide means includes beam splitter means arranged between said first plane and said projection optical means.

10. An optical apparatus according to claim 8, wherein said light guide means includes polarizing beam splitter means arranged between said first plane and said projection optical means.

11. An optical apparatus according to claim 10, wherein said light guide means further includes a polarizing plate arranged between said radiaiton means and said polarizing beams splitter means, and a $\frac{1}{4}$ wavelength plate arranged between said first plane and said polarizing beam splitter means.

* * * * *